US010096675B2

(12) United States Patent
Stockman

(10) Patent No.: US 10,096,675 B2
(45) Date of Patent: Oct. 9, 2018

(54) SPASERS TO SPEED UP CMOS PROCESSORS

(71) Applicant: Georgia State University Research Foundation, Atlanta, GA (US)

(72) Inventor: Mark Stockman, Atlanta, GA (US)

(73) Assignee: Georgia State University Research Foundation, Atlanta, GA (US)

( * ) Notice: Subject to any disclaimer, the term of this patent is extended or adjusted under 35 U.S.C. 154(b) by 370 days.

(21) Appl. No.: 14/777,769

(22) PCT Filed: Apr. 11, 2014

(86) PCT No.: PCT/US2014/033862
§ 371 (c)(1),
(2) Date: Sep. 17, 2015

(87) PCT Pub. No.: WO2014/169246
PCT Pub. Date: Oct. 16, 2014

(65) Prior Publication Data
US 2016/0290921 A1    Oct. 6, 2016

Related U.S. Application Data

(60) Provisional application No. 61/811,399, filed on Apr. 12, 2013, provisional application No. 61/816,387, filed on Apr. 26, 2013.

(51) Int. Cl.
*H01L 29/00* (2006.01)
*H01L 29/08* (2006.01)
(Continued)

(52) U.S. Cl.
CPC .......... *H01L 29/0847* (2013.01); *B82Y 20/00* (2013.01); *G02B 6/1226* (2013.01);
(Continued)

(58) Field of Classification Search
CPC .... H01L 29/0847; B82Y 20/00; G02B 6/1226
See application file for complete search history.

(56) References Cited

U.S. PATENT DOCUMENTS 7,569,188 B2    8/2009  Stockman et al.
8,017,406 B2    9/2011  Stockman et al.
(Continued)

FOREIGN PATENT DOCUMENTS

EP          1939657       7/2008
WO      WO 2012/015990    2/2012

OTHER PUBLICATIONS

Extended European Search Report for European Patent Application No. 14782288.6, dated Nov. 14, 2016.
(Continued)

*Primary Examiner* — Tri Ton
*Assistant Examiner* — Rebecca C Bryant
(74) *Attorney, Agent, or Firm* — King & Spalding

(57) ABSTRACT

A processor includes a transistor pair of a first transistor and a second transistor. The first transistor of the transistor pair is coupled to a Spaser and configured to output a drive current to the Spaser to pump the Spaser. Responsive to the drive current, the Spaser outputs surface plasmon polaritons (SPPs) which are fed to a plasmonic interconnect wire. The plasmonic interconnect wire propagates the SPPs. Further, the SPPs propagated on the plasmonic interconnect wire are detected by a phototransistor. Responsive to detecting the SPPs, the phototransistor generates an output current that is fed to a gate terminal of the second transistor to charge the second transistor.

29 Claims, 4 Drawing Sheets

(51) Int. Cl.
*H01L 31/113* (2006.01)
*H01L 29/78* (2006.01)
*B82Y 20/00* (2011.01)
*G02B 6/122* (2006.01)
*H01L 29/165* (2006.01)
*H01L 23/528* (2006.01)
*H01L 27/092* (2006.01)

(52) U.S. Cl.
CPC .......... *H01L 29/78* (2013.01); *H01L 31/1136* (2013.01); *H01L 23/5283* (2013.01); *H01L 27/092* (2013.01); *H01L 29/165* (2013.01)

(56) References Cited

U.S. PATENT DOCUMENTS

| | | |
|---|---|---|
| 2003/0179974 A1 | 9/2003 | Estes et al. |
| 2009/0065901 A1 | 5/2009 | Conway et al. |
| 2009/0243589 A1 | 10/2009 | Blumberg |
| 2010/0129085 A1 | 5/2010 | Smolyaninov et al. |
| 2010/0316078 A1 | 12/2010 | Ono |

OTHER PUBLICATIONS

Office Action as issued for corresponding Chinese Patent Application No. 201480020864.8, dated Sep. 2, 2016 by State Intellectual Property Office.

International Search Report for PCT/US2014/033862, dated Sep. 15, 2014.

Stockman et al., "Localization versus Delocalization of Surface Plasmons in Nanosystems: Can One State Have Both Characteristics?", Physical Review Letters, 87 (16), Oct. 15, 2001, pp. 167401-1-167401-4.

Kulakovich et al., "Enhanced Luminescence of CdSe Quantum Dots on Gold Colloids", Nano-Letters, 2002, 2 (12), pp. 1449-1452, published on Web Nov. 7, 2002.

Shimizu et al., "Surface-Enhanced Emission from Single Semiconductor Nanocrystals", Physical Review Letters, 89 (11), Sep. 2002, pp. 117401-1-117401-4.

Gryczynski et al., "Surface-Plasmon Coupled Emission of Quantum Dots", Journal of Physical Chemistry B, 109, 2005, pp. 1088.1093.

SPASERS TO SPEED UP CMOS PROCESSORS

CROSS-REFERENCE TO RELATED APPLICATIONS

This application is a national phase application under 35 U.S.C. § 371 of International Application No. PCT/US2014/033862, filed on 11 Apr. 2014, which claims priority to U.S. Provisional Application No. 61/811,399 filed on Apr. 12, 2013 in the name of Mark Stockman and entitled "Spasers to speed up CMOS processors hundredfold," and U.S. Provisional Application No. 61/816,387 filed on Apr. 26, 2013 in the name of Mark Stockman and entitled "Transistor Pair with Spaser-Driven Interconnect," the entire contents of each application being incorporated herein by reference.

This application is related to U.S. Pat. No. 8,017,406 filed on Apr. 30, 2009 in the name of Mark L. Stockman and David J. Bergman and entitled "Method for Surface Plasmon Amplification by Stimulated Emission of Radiation (SPASER)," which is a divisional of U.S. Pat. No. 7,569,188 filed on Jan. 5, 2004 in the name of Mark L. Stockman and David J. Bergman and entitled "Surface Plasmon Amplification by Stimulated Emission of Radiation (SPASER)," which claims the benefit of, and priority to, U.S. Provisional Patent Application No. 60/437,760 filed on Jan. 3, 2003, each patent being incorporated by reference herein in its entirety.

STATEMENT OF GOVERNMENT LICENSE RIGHTS

The U.S. Government may have certain rights in this invention, as provided for by the terms of Grants No. DE-FG02-01ER15213 and No. DE-FG02-11ER46789 awarded by the U.S. Department of Energy.

TECHNICAL FIELD

This disclosure relates generally to the field of semiconductor and plasmonic devices, and more particularly to surface plasmon amplification by stimulated emission of radiation for improving an operational speed and energy efficiency of a CMOS processor.

BACKGROUND

In conventional processors, while transistors (e.g., metal-oxide semiconductor field effect transistors (MOSFETs)) that form an integral part of a processor work at speeds up to the limit of their cutoff frequency ($f_{cutoff}$), the processors themselves work significantly slower (e.g., typically two orders of magnitude) than the transistors. For example, operational speed of transistors (MOSFET) in a processor is approximately 100-300 GHz, while the operational speed (clock rate) of the processor is about or below 3 GHz. Even though a new generation of transistors and processors are produced every two years (following, so far, Moore's law), the speed of the processors have continued to remain significantly slower than the operational speed of the underlying transistors that form the processors.

The slower operational speed of conventional processors 100 can be attributed to metal interconnect wires 108 that occupy most of the processor volume as illustrated in FIG. 1B. Further, as illustrated in FIG. 1A, conventional processors are built on CMOS technology where the drive (output) current of one transistor electrostatically charges an interconnect wire and the gate of the complementary transistor. In particular, FIG. 1A illustrates configuration of an example transistor pair of a processor 100 comprising a first transistor 102 that electrostatically charges the interconnect copper wire 106 which in turn charges the gate of the second transistor 104. This electrostatic charging of an interconnect wire in a processor limits the processor speed at least due to an effect of the resistance (R) and capacitance (C) of the interconnect wire. In particular, the resistance and capacitance of the interconnect wire defines the maximum achievable processor speed as f=1/RC. Accordingly, by using standard expressions for resistance and capacitance as shown in Equation 1, standard expression for maximum achievable processor speed as shown in Equation 2, and substituting realistic values for the parameters of the Equation 1 and Equation 2, it can be observed that the maximum achievable processor speed is much slower than the intrinsic transistor speed $f_{cutoff}$.

$$C = \frac{\varepsilon L}{2\ln\frac{L}{A}}, \quad R = \frac{L}{\pi\sigma a^2} \tag{1}$$

and $$f_{RC} = \frac{1}{RC} \tag{2}$$

For example, in the above-mentioned Equation 1, L which is the interconnect wire length can be realistically set as 1 mm, 'a' which is its radius of the interconnect wire can be realistically set as 10 nm, $\varepsilon\sim 8$ is the permittivity of the surrounding material in the processors (average that of silicon (11.9) and silicon dioxide (3.9)), and $\sigma\sim 6\times 10^7$ Mho/m is the conductivity of copper. On the basis of the values of each parameter provided above, the maximum achievable processor speed can be derived to be 2.4 GHz which is close to that of actual processors [Pasricha, S. & Dutt, N. *On-chip Communication Architectures: System on Chip Interconnect* (Morgan Kaufmann, 2008)] and two orders of magnitude smaller than the intrinsic transistor speed, which is approximately 100-300 GHz.

Further, currently, the speed of conventional processors are not defined by maximum transistor speed, i.e., the cutoff frequency $f_{cutoff}$ of the transistor because $f_{cutoff} \gg f_{RC}$, which makes the cutoff frequency irrelevant for defining the processor speed. Instead, the technical descriptions define the processor speed based on the output or drive current of the transistor, i.e., $I_d \sim 1$ μA per nm of the gate width of the transistor, which for typical 30 nm gate yields $I_d \sim 30$ μA [Packan, P. et al. High performance 32 nm logic technology featuring $2^{nd}$ generation high-k+metal gate transistors, in: 2009 *IEEE International Electron Devices Meeting (IEDM)* 1-4 (2009)]. The drive current may define the processor speed because it the drive current of the underlying transistor that charges of the interconnect wire to a potential difference $\Delta U \sim 0.25$ V, which is needed to control the complimentary transistor in the processor (e.g., in processors where transistors work in pairs). This limits the processor's maximum speed to [Krausz, F. & Stockman, M. I. Attosecond metrology: from electron capture to future signal processing. *Nature Photonics* doi: 10.1038/nphoton.2014.28 (2014)]:

$$f_{max} = I_d/(C\,\Delta U) \sim 3 \text{ GHz}, \tag{3}$$

which is close to the maximum actual processor speed of contemporary processors [Pasricha, S. & Dutt, N. *On-chip Communication Architectures: System on Chip Interconnect* (Morgan Kaufmann, 2008)].

The significant slowing down of the processor speed, e.g., by two orders of magnitude with respect to the transistor speed, $f_{cutoff}$, results in a commensurate decrease of the energy efficiency of the processor by the same factor. Further, the decrease in the energy efficiency of the processor can also be attributed to the fact that the electrostatic energy stored in interconnect wires are wasted when the transistors switch because only energy which is stored in the orders of magnitude smaller (than that of the wires) gate capacitance of the transistor (e.g., MOSFET) is useful because it defines the drive current, and consequently, the transistor and processor functionalities. As a result, conventional processors have a high heat production per operation. Accordingly, there exists a need for technology that can overcome the above-mentioned shortcomings and improve an operational speed of the conventional processors.

SUMMARY

The present disclosure can address the needs described above and improve an operational speed of CMOS processors through surface plasmon amplification by stimulated emission of radiation. Before discussing the embodiments directed to the method and system for improving operational efficiency of CMOS processors by surface plasmon amplification by stimulated emission of radiation, it may assist the reader to understand the various terms used herein by way of a general description of the terms in the following paragraphs.

A device that emits surface plasmons based on surface plasmon amplification by stimulated emission of radiation action maybe referred to as 'Spaser'. In other words, Spaser is a nanoscopic generator and amplifier of nanolocalized optical fields via surface plasmon amplification by stimulated emission of radiation (SPASER) action. In the following disclosure, the term 'Spaser' may be interchangeably referred to as 'Spaser device,' without departing from the broader scope of the disclosure. Further, the term 'SPASER action' may be interchangeably referred to as 'spasing,' without departing from the broader scope of this disclosure.

In general, a Spaser may include a resonant medium having at least one surface plasmon mode and an active (or, gain) medium. An energy source may apply energy to the active medium resulting in energy transition of an object that is present in the active medium. The object in the active medium may have significant transition strength. Example objects can include, but are not limited to, a rare-earth ion, a dye molecule, a semiconductor quantum dot, semiconductor quantum well, or nanoscopic layer of a semiconductor. The energy transition of the object in the active medium causes population inversion in the active medium which in turn stimulates the emission of at least one surface plasmon in the resonant medium. The process of applying energy to the active medium to cause a population inversion in the active medium may generally be referred to as a 'pumping' action or 'pumping the Spaser'. The structure of the Spaser, the operation of the Spaser, the pumping action, and other related operations associated with the SPASER action are described in greater detail in U.S. Pat. No. 8,017,406 filed on Apr. 30, 2009 in the name of Mark L. Stockman and David J. Bergman and entitled "Method for Surface Plasmon Amplification by Stimulated Emission of Radiation (SPASER)," which is divisional of U.S. Pat. No. 7,569,188 filed on Jan. 4, 2004 in the name of Mark L. Stockman and David J. Bergman and entitled "Surface Plasmon Amplification by Stimulated Emission of Radiation (SPASER)," which claims the benefit of, and priority to, U.S. Provisional Patent Application No. 60/437,760 filed on Jan. 3, 2003, the entire contents of each patent being incorporated by reference herein in its entirety.

Further, a summary of the theoretical aspects of Spasers are described in the following paper: D. J. Bergman and M. I. Stockman, '*Surface Plasmon Amplification by Stimulated Emission of Radiation: Quantum Generation of Coherent Surface Plasmons in Nanosystems*', Phys. Rev. Lett. 90, 027402 (January 2003), the entire contents of which are hereby incorporated herein by reference. A more detailed presentation of Spaser theory is described in paper [Stockman, M. I. The spaser as a nanoscale quantum generator and ultrafast amplifier. *Journal of Optics* 12, 024004-1-13 (2010)], the entire contents of which are hereby incorporated herein by reference.

The term 'surface plasmons,' (herein 'SPs') as used herein may generally refer to coherent electron oscillations that exist at the interface between any two materials where the real part of the dielectric function changes sign across the interface (e.g. a metal-dielectric interface, such as a metal sheet in air). Accordingly, a Spaser can also be described as an apparatus for generation and amplification of nanoscale oscillating electric field via SPASER action.

Further, the term 'surface plasmon polaritons,' (herein 'SPPs') as used herein may generally refer to infrared or visible-frequency electromagnetic waves, which travel along a metal-dielectric or metal-air interface. The term surface plasmon polariton explains that the wave involves both charge motion in the metal ("surface plasmon") and electromagnetic waves in the air or dielectric ("polariton").

One advantage of using a Spaser is that the Spaser allows to send optical waves over the interconnect wires between transistor pairs of a CMOS processor, instead of electrostatically charging the interconnect wires and thereby help overcome the above-mentioned shortcomings associated with electrostatically charging of the interconnect wires as described in the background section. Another advantage of using a Spaser is that it has a modal volume that is smaller than that of microlasers which makes it correspondingly faster. Further, the smaller modal volume allows Spasers to be directly modulated at a speed in the THz range, which in turn opens up possibilities of using Spasers as a source of energy in high speed plasmon-polariton interconnects. Additional description regarding the use of Spasers as a source of energy in high speed plasmon-polariton interconnects is provided in the following paper: Dabing Li and Mark I. Stockman, *Electric Spaser in the Extreme Quantum Limit*, Phys. Rev. Lett. 110, 106803-1-5 (2013), the entire contents of which are hereby incorporated herein by reference. As described above, using such Spaser driven interconnects allows increasing the speed of the processors and correspondingly decreasing the energy consumption and heat production per operation by the processors.

In one aspect, a processor includes a transistor pair of a first transistor and a second transistor. The first and second transistor pairs are configured to operationally communicate by sending optical waves over an interconnect wire that couples the first transistor to the second transistor. In particular, the first transistor of the transistor pair is coupled to a Spaser and the first transistor is configured to pump the Spaser which in turn outputs SPPs. The SPPs that are outputted from the Spaser are fed to an interconnect wire that is configured to propagate the SPPs. The SPPs propagated on the interconnect wire are detected by a phototransistor whose output current charges the gate of the second transistor of the transistor pair. In other words, optical waves transfer optical energy over the interconnect wire to the second transistor of the transistor pair, which, thus, provides the same functionality for the processor without electrostatically charging the interconnect wire.

These and other aspects, features, and embodiments of the present invention may be more clearly understood and appreciated from a review of the following detailed description of the disclosed embodiments and by reference to the drawings and claims.

BRIEF DESCRIPTION OF THE DRAWINGS

Example embodiments are illustrated by way of example and not limitation in the figures of the accompanying drawings, in which.

Figure 1A:
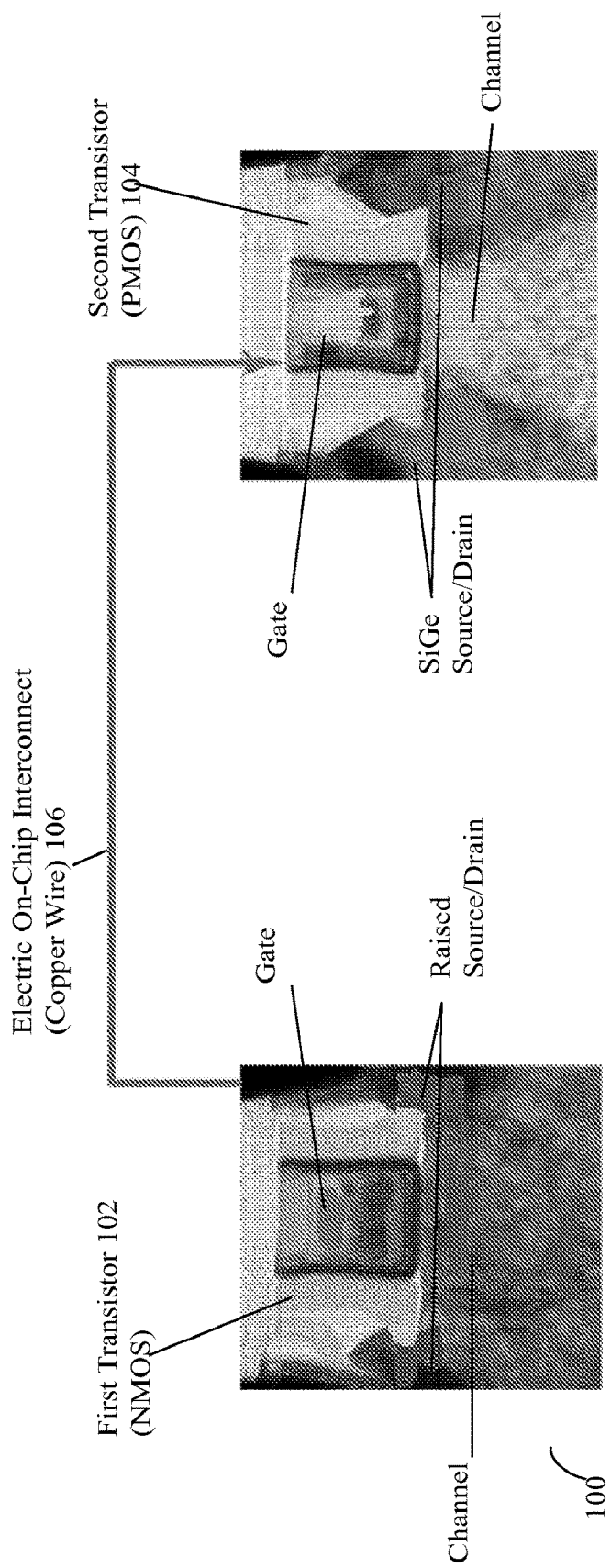
FIG. 1A illustrates a conventional processor where the interconnect wires are electrostatically charged for operation of a transistor pair, according to certain exemplary embodiments.
Figure 1B:
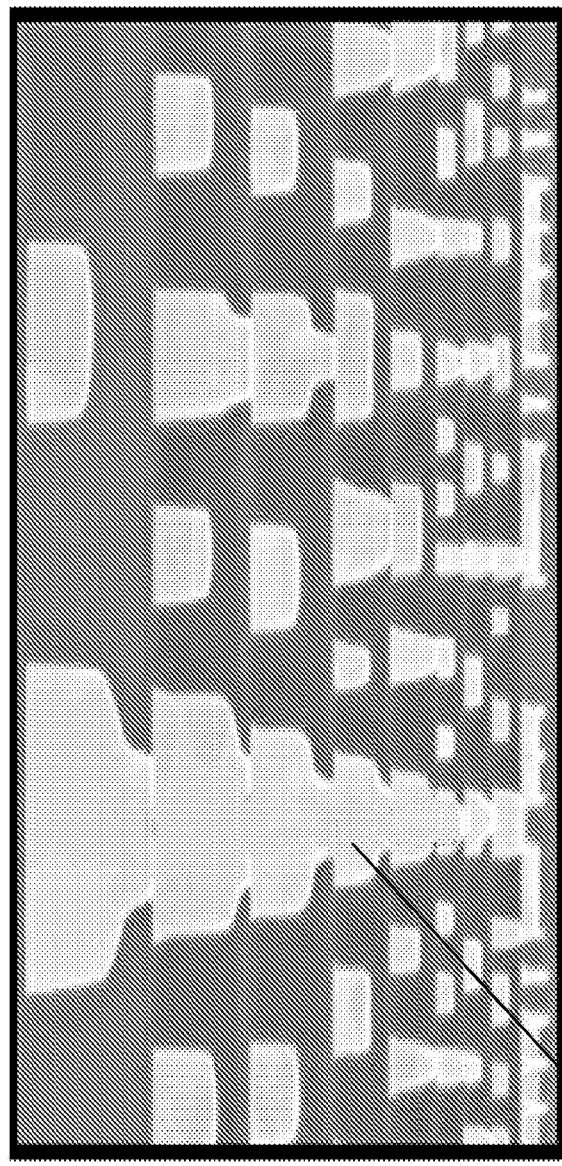
FIG. 1B illustrates an interconnect architecture of a conventional processor, according to certain exemplary embodiments.

Many aspects of the invention can be better understood with reference to the above drawings. The elements and features in the drawings are not to scale; emphasis is instead being placed upon clearly illustrating the principles of example embodiments of the present invention. Moreover, certain dimensions may be exaggerated to help visually convey such principles. In the drawings, reference numerals designate like or corresponding, but not necessarily identical, elements throughout the several views. Other features of the present embodiments will be apparent from the Detailed Description that follows.

DETAILED DESCRIPTION OF EXAMPLE EMBODIMENTS

Disclosed are a system and a method for improving operational efficiency of CMOS processors by surface plasmon amplification by stimulated emission of radiation. In exemplary embodiments of the present disclosure, a processor may include a pair of transistors that are coupled via an interconnect wire and communicate using nanolocalized optical fields propagated over the interconnect wire.

As described above and as illustrated in FIG. 1A, interconnect wires may consume a large portion of the processor volume. In particular, these interconnect wires forms a bottom layer of a processor chip and are separated by distances that are proportional to the size of the transistors, i.e., approximately 20 nanometers (nm) based on current chip fabrication technology. In other words, the interconnect wires are very close to each other, which may lead to overlap of optical fields on one interconnect wire with the optical fields of a neighboring interconnect wire. The overlap of optical fields from one interconnect wire to another neighboring interconnect wire may lead to severe cross-talk.

Accordingly, to avoid such cross-talk and overlap of optical fields, the optical fields propagated over the interconnect wires need to be localized at distances on the order of the wire radius, which is approximately 20 nm. Such localization of the optical fields as described above is achievable if the optical mode in the interconnect wire is a plasmonic mode, particularly surface plasmon polaritons (SPPs). Specifically for a cylindrical-symmetry wire, an SPP mode without cutoff is the $TM_0$ mode, which is an SPP of the type that is used in the adiabatic compression on a nanocone [Stockman, M. I. Nanofocusing of Optical Energy in Tapered Plasmonic Waveguides. *Physical Review Letters* 93, 137404-1-4 (2004); Giugni, A. et al. Hot-electron nanoscopy using adiabatic compression of surface plasmons. *Nat. Nano* 8, 845-852 (2013)], or its planar counterpart. In an example embodiment, propagating SPPs on the interconnect wire can be achieved by using Spasers as illustrated in FIG. 2 which is described in greater detail in the following paragraphs.

Figure 2:
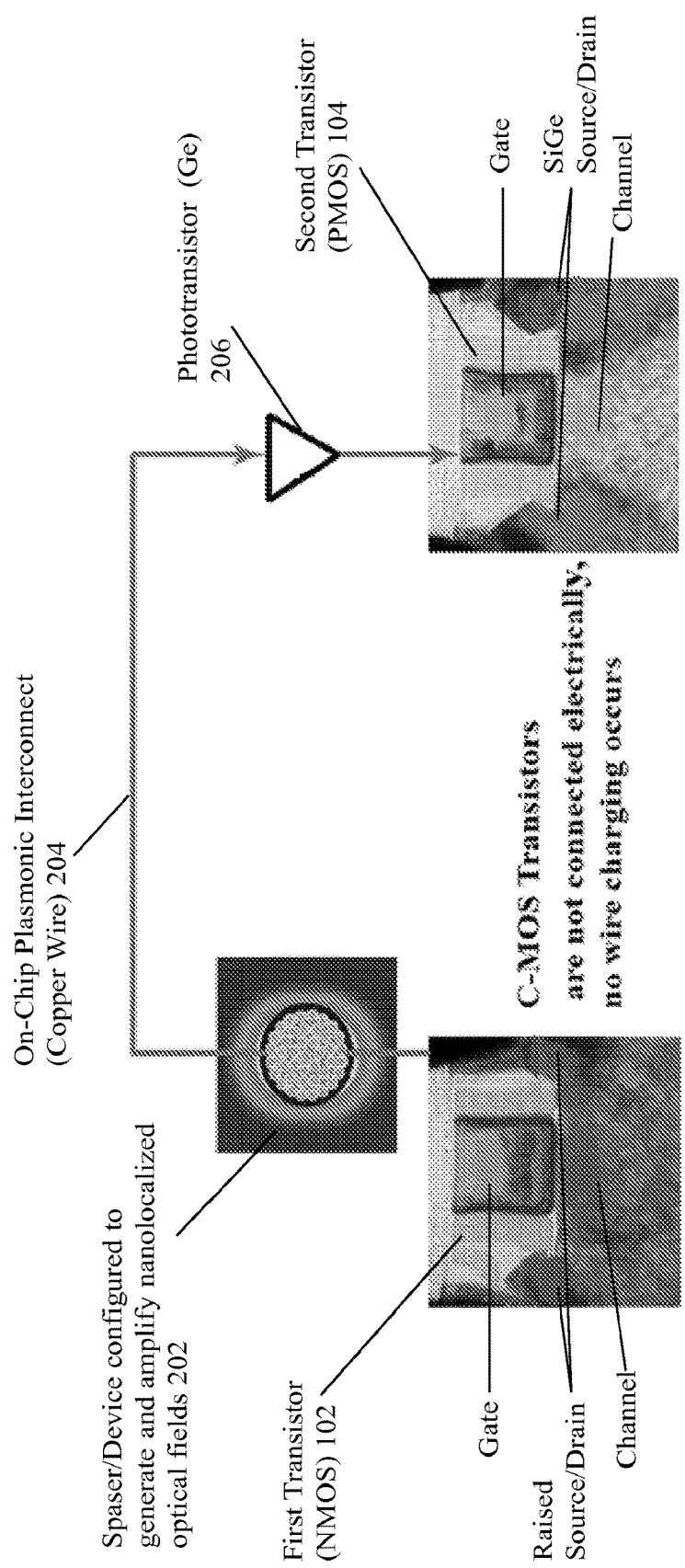
FIG. 2 illustrates a processor that is configured for propagation of optical waves along an interconnect wire for operation of a transistor pair, according to certain exemplary embodiments.

Turning to FIG. 2, this figure illustrates a processor configured for optical waves to propagate along an interconnect wire for operation of a transistor pair, according to certain exemplary embodiments. In particular, FIG. 2 illustrates a configuration of a first transistor 102 and a second transistor 104 of an example transistor pair in a processor 200 to achieve an improved processor operational speed by SPASER action.

Referring to FIG. 2, in one embodiment, an output terminal of the first transistor 102 may be coupled to an input of the Spaser 202 such that the Spaser is directly pumped by the first transistor 102. In one embodiment, the output terminal of the first transistor 102 may refer to a drain terminal. However, one or ordinary skill in the art can understand and appreciate that the Spaser 202 can alternatively be coupled to a source terminal of the first transistor 102. In an alternate embodiment, the Spaser 202 may be a constituent part of the first transistor 102, for example, the drain of the transistor. In yet another embodiment, the Spaser 202 may be electrically pumped by an external energy source other than the first transistor 102. In an example embodiment, the Spaser 202 can be pumped electrically via a nanowire with a ballistic resistance.

Continuing with FIG. 2, an output of the Spaser 202 may be coupled to an interconnect wire which may be a copper wire, in one example. In another example, the interconnect wire 206 may be an aluminum wire or a doped semiconductor (conducting oxide) wire. In yet another example, the interconnect wire 206 may be any appropriate wire that has a propagating plasmonic mode or is capable of propagating SPPs. The interconnect wire is further coupled to a phototransistor 206 on an end that is different from the end that is coupled to the Spaser 202 such that the interconnect wire propagates an output of the Spaser 202 to the phototransistor 206. In one example, the phototransistor 206 as illustrated in FIG. 2 may be a germanium (Ge) near-field phototransistor, whereas in other example, the phototransistor 206 may be any appropriate photodetector that is capable of detecting SPPs. In addition, an output terminal of the phototransistor may be coupled to a gate terminal of the second transistor 104 for charging the second transistor 104.

In an example embodiment, the Spaser 202 can have a form factor that approximately matches the form factor of the first transistor 104 or the second transistor 102 for achieving high energy efficiency. In particular, the Spaser 202 can have a size ranging from approximately 10 nm to 100 nm. Accordingly, as described above, in an alternate embodiment, the Spaser 202 can form a constituent part of the first transistor 102, for example, the drain of the transistor. Further, the Spaser 202 is configured to follow modulation at speeds ranging from 1 terahertz (THz) to 10 THz. In other words, the Spaser is configured to allow direct modulation at least as fast as the first and/or the second transistors 102, 104. In addition, the Spaser 202 is configured to produce temporarily coherent intense fields with low noises.

In one embodiment, the metal used in a plasmonic core of the Spaser 202 can include gold and/or silver. In another embodiment, the metal used in the plasmonic core of the Spaser 202 can include metals that are CMOS compatible, such as aluminum or copper. In yet another embodiment, the plasmonic core of the Spaser 202 can include highly-doped conducting oxides which may be CMOS compatible.

One of ordinary skill in the art can understand and appreciate that replacing the Spaser 202 illustrated in FIG. 2 with spontaneous emitters, such as electrically-pumped diode that can directly emit SPPs is not outside the scope of this disclosure. However, it is advantageous to use a Spaser 202 instead of the spontaneous emitters because the Spaser 202 cannot be saturated (up to the limit of the material damage). This is because the stimulated emission rate of the Spaser 202 in the developed spasing regime is proportional to the pumping rate (current) with no saturation. In contrast, the spontaneous emission rate associated with spontaneous emitters is always limited by the exciton (electron-hole) lifetime. Additionally, the Spaser 202 has an advantage of reduced fluctuations compared to the spontaneous emitters because Spasers produce coherent fields with low noises as described above.

The relation of the stimulated emission rate of the Spaser with the pumping rate (current) as mentioned above is described in greater detail in the following papers: Dabing Li and Mark I. Stockman, *Electric Spaser in the Extreme Quantum Limit*, Phys. Rev. Lett. 110, 106803-1-5 (2013), and M. I. Stockman, *Spaser as Nanoscale Quantum Generator and Ultrafast Amplifier*, J. Opt. 12, 024004-1-13 (2010), the entire contents of each of which is hereby incorporated herein by reference.

Figure 3:
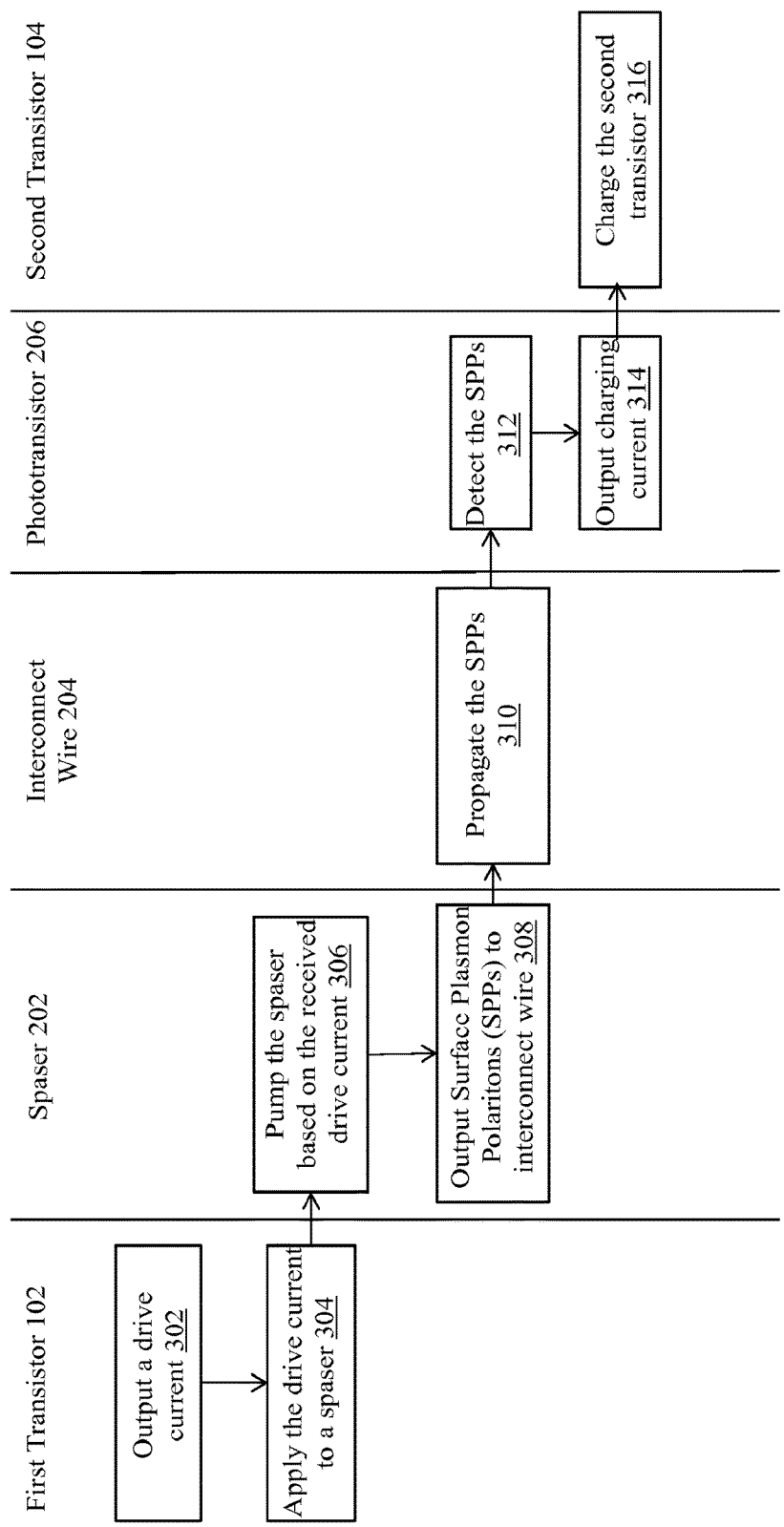
FIG. 3 is a flow chart that illustrates a method of improving an operation speed of a processor by surface plasmon amplification by stimulated emission of radiation, according to certain exemplary embodiments.

Turning to FIG. 3, this figure is a flow chart that illustrates a method of improving an operation speed of processor by surface plasmon amplification by stimulated emission of radiation, according to certain exemplary embodiments. In operations 302 and 304, the first transistor 102 outputs a drive current and applies the drive current to the Spaser 202. In operation 306, the drive current from the first transistor 102 pumps the Spaser 202. As described above, the electrical pumping of the Spaser 202 can be done via a nanowire with a ballistic resistance. Upon pumping, in operation 308, the Spaser 202 generates SPs. In addition, in operation 308, the generated SPs are coupled in the near-field to the propagating SPPs of the interconnect wire 204. In other words, in operation 308, the Spaser 202 outputs SPPs which are then fed to the interconnect wire 204. Then, in operation 310, the interconnect wire 204 propagates the SPPs outputted by the Spasers 202 across the chip.

In operation 312, the SPPs on the interconnect wire are detected by the phototransistor 206 that is coupled to another end of the interconnect wire 204. In response to detecting the SPPs, in operation 314, the phototransistor 206 generates an output current or charging current that is applied to a gate terminal of the second transistor 104. Further, in operation 316, the second transistor 104 is charged based on the output current of the phototransistor 206.

Although specific operations are disclosed in the flowcharts illustrated in FIG. 3, such operations are exemplary. That is, embodiments of the present invention are well suited to performing various other operations or variations of the operations recited in the flowcharts. It is appreciated that the operations in the flowcharts illustrated in FIG. 3 may be performed in an order different that presented, and that not all of the operations in the flowcharts may be performed.

The following section theoretically illustrates that the Spaser generates SPPs in sufficient numbers so that there will be enough photoelectrons produced in the near-field photodetector to charge the gate of the second transistor. Quantitative Demonstration: Spaser can Generate Sufficient SPPs to Trigger a Phototransistor to Produce Photoelectrons to Charge the Gate of a Receiving Transistor The number of electrons that charge the gate of the second transistor, e.g., MOSFET to a potential difference $\Delta U=0.2$ V to 0.3 V, is $$N_e = \frac{C_g \Delta U}{e} \sim 200 - 300, \tag{3}$$

where 'e' is elementary charge, and $C_g$ is the gate capacitance which is represented by the following Equation 4:

$$C_g = \frac{\varepsilon_{ox} S}{2\pi d}, \tag{4}$$

where $\varepsilon_{ox} \sim 10$ is the gate-oxide permittivity, $S \sim (30 \text{ nm})^2$ is the gate area, and $d \sim 1$ nm is the oxide thickness.

Further, the number of SPs that a Spaser 202 produces during a transistor switch (flop) time $T_{flop} \sim 3$ picosecond (ps) (i.e., shortest transistor flop time) can be determined to be approximately $1.5 \times 10^3$ by using following Equation 5:

$$N_{SP} \sim \frac{N_c \omega_n T_{flop}}{\pi}, \tag{5}$$

where $N_c \sim 1$ is the number of the open quantum channels in a nanowire, and $\omega_n \sim 1$ eV/h is the Spaser 202 (angular) frequency. For a reasonable efficiency of the near-field phototransistor, the number of SPs $\sim 1.5 \times 10^3$ can produce approximately 200-300 electrons that can charge the gate of the second transistor 104 to a potential difference of $\Delta U=0.2$ V to 0.3 V.

From the description of the example embodiments, equivalents of the elements shown therein will suggest themselves to those skilled in the art, and ways of constructing other embodiments will appear to practitioners of the art. Therefore, the scope of the present disclosure is to be limited only by the claims that follow. Further, the specification and drawings are to be regarded in an illustrative rather than a restrictive sense.

What is claimed is:
1. A system, comprising:
   a device that is configured to generate and amplify nanolocalized optical fields via a Surface Plasmon Amplification by Stimulated Emission of Radiation (SPASER) action;
   a first transistor of a transistor pair coupled to the device and configured to supply drive current to the device to initiate a pumping action associated with the SPASER action;

a phototransistor coupled to the device via an interconnect wire; and a second transistor of the transistor pair coupled to the phototransistor and configured to receive an output current from the phototransistor, wherein responsive to drive current, the device is configured to generate surface plasmons (SPs) that are coupled in a near-field to propagating surface plasmon polaritons (SPPs) of the interconnect wire, and wherein responsive to detection of the SPPs the phototransistor is configured to generate the output current for charging a gate of the second transistor.

2. The system of claim 1, wherein the device is connected to one of a drain or a source of the first transistor.

3. The system of claim 2, wherein the device forms a constituent element of one of the drain or the source for the first transistor.

4. The system of claim 1, wherein the interconnect wire comprises a plasmonic copper wire capable of propagating the SPPs.

5. The system of claim 1, wherein the drive current supplied by the first transistor provides a direct electrical pumping for the SPASER action.

6. The system of claim 5, wherein the device is configured to allow direct pumping by the first transistor to initiate a SPASER action.

7. The system of claim 1, wherein the device is configured such that a form factor of the device is substantially similar to a form factor of the first transistor.

8. The system of claim 1, wherein the device is configured for direct modulation of the SPASER action at a speed that is substantially similar to the working frequency of at least one of the first transistor and the second transistor of the transistor pair.

9. The system of claim 1, wherein the phototransistor applies the output current to a gate of the second transistor of the transistor pair.

10. A method of a nanostructure that generates and amplifies nanolocalized optical fields via Surface Plasmon Amplification by Stimulated Emission of Radiation (SPASER) action comprising:

receiving, by the nanostructure, an electrical energy to initiate a pumping action associated with the SPASER action; and responsive to initiating the pumping action, outputting, by the nanostructure, surface plasmon polaritons (SPPs) to a plasmonic interconnect wire that propagates the SPPs to a light-sensitive transistor that is configured to detect the SPPs and charge a gate of a transistor associated with a transistor pair.

11. The method of claim 10, wherein the step of outputting the SPPs further comprises generating, by the nanostructure, surface plasmons (SPs) that are coupled in the near-field to the propagating (SPPs) of the plasmonic interconnect wire.

12. The method of claim 10, wherein the electrical energy is received from an external electrical energy source.

13. The method of claim 10, wherein the electrical energy is a drive current of another transistor of the transistor pair.

14. The method of claim 10, wherein the plasmonic interconnect wire is a copper wire capable of propagating the SPPs.

15. The method of claim 10, wherein the nanostructure is coupled to an output terminal of the other transistor that delivers the drain current to the nanostructure.

16. The method of claim 10, wherein the light-sensitive transistor is coupled nanostructure via the plasmonic interconnect wire.

17. The method of claim 10, wherein responsive to detection of the SPPs by the light-sensitive transistor, the light-sensitive transistor is configured to generate an output current that charges the gate of the transistor.

18. The method of claim 10, wherein the form factor of the nanostructure approximately matches the form factor of at least one of the transistors of the transistor pair.

19. A method, comprising:

applying, by a first transistor of a transistor pair, drive current output to a device for Surface Plasmon Amplification by Stimulated Emission of Radiation (Spaser device) to directly modulate the SPASER device, the SPASER device responsive to the drive current to output surface plasmons (SPs) that couple in the near-field to propagating surface plasmon polaritons (SPPs) of an interconnect wire; and receiving, by a second transistor of the transistor pair, charging current from a phototransistor that is configured to detect the SPPs from the SPASER device, the phototransistor to generate the charging current responsive to the SPPs.

20. The method of claim 19, wherein applying the drive current by a first transistor comprises outputting the driver current by one of a drain or a source of the first transistor.

21. The method of claim 19, wherein responsive to the SPPs, the phototransistor is configured to generate the charging current for application to a gate of the second transistor.

22. The method of claim 19, wherein the interconnect wire comprises a plasmonic copper wire capable of propagating the SPPs, and wherein the SPASER device is coupled to the phototransistor via the interconnect wire.

23. The method of claim 19, wherein the drive current output by the first transistor provides a direct electrical pumping of the SPASER device.

24. The method of claim 23, wherein the direct electrical pumping of the SPASER device is operative to directly modulate the SPASER device.

25. A processor, comprising:

a transistor pair comprising a first transistor and a second transistor, the first transistor configured to output a drive current and the second transistor configured to receive a charging current;

a device configured to generate surface plasmons (SPs) via a Surface Plasmon Amplification by Stimulated Emission of Radiation (SPASER) action responsive to the drive current output by the first transistor; and a phototransistor, connected to the device via an interconnect wire and configured to generate the charging current for charging a gate of the second transistor responsive to the SPs output by the device to the interconnect wire.

26. The processor of claim 25, wherein the SPs couple in the near-field to propagating surface plasmon polaritons (SPPs) of the interconnect wire.

27. The processor of claim 26, wherein the device is coupled to an output terminal of the first transistor, the second transistor is coupled to an output terminal of the phototransistor, and the device is coupled to the phototransistor via the interconnect wire that is capable of propagating SPPs.

28. The system of claim 1, wherein the interconnect wire comprises an aluminum wire.

29. The system of claim 1, wherein the interconnect wire comprises a doped semiconductor wire.

* * * * *